US010964652B2

(12) United States Patent
Chen et al.

(10) Patent No.: US 10,964,652 B2
(45) Date of Patent: Mar. 30, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Chien-Hua Chen, Kaohsiung (TW); Sheng-Chi Hsieh, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 60 days.

(21) Appl. No.: 16/388,829

(22) Filed: Apr. 18, 2019

(65) Prior Publication Data

US 2020/0335458 A1   Oct. 22, 2020

(51) Int. Cl.
| | | |
|---|---|---|
| H01L 27/14 | (2006.01) | |
| H01L 23/66 | (2006.01) | |
| H01L 23/31 | (2006.01) | |
| H01L 23/538 | (2006.01) | |
| H01L 23/00 | (2006.01) | |
| H01L 21/56 | (2006.01) | |
| H01L 21/48 | (2006.01) | |
| H01Q 1/22 | (2006.01) | |
| H01Q 9/16 | (2006.01) | |

(52) U.S. Cl.
CPC ......... *H01L 23/66* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01Q 1/2283* (2013.01); *H01Q 9/16* (2013.01); *H01L 2223/6677* (2013.01); *H01L 2224/214* (2013.01)

(58) Field of Classification Search
CPC ............. H01L 21/4857; H01L 21/4853; H01L 21/565; H01L 23/66; H01L 23/5383; H01L 23/5389; H01L 23/3128; H01L 23/5386; H01L 24/19; H01L 24/20
USPC ........................................................ 257/428
See application file for complete search history.

(56) References Cited

U.S. PATENT DOCUMENTS

| | | | |
|---|---|---|---|
| 10,096,558 B1* | 10/2018 | Chiang | H01L 23/66 |
| 10,157,807 B2* | 12/2018 | Chiang | H01L 24/24 |
| 10,325,786 B1* | 6/2019 | Chen | H01L 21/568 |
| 10,340,234 B2* | 7/2019 | Kim | H01Q 1/2283 |
| 2019/0198972 A1* | 6/2019 | Chen | H01Q 1/2283 |
| 2019/0198973 A1* | 6/2019 | Chen | H01L 23/53257 |
| 2019/0288370 A1* | 9/2019 | Chen | H01L 23/49816 |
| 2019/0305428 A1* | 10/2019 | Hwang | H01Q 21/0075 |
| 2020/0091095 A1* | 3/2020 | Jung | H01L 23/538 |

* cited by examiner

*Primary Examiner* — Luan C Thai
(74) *Attorney, Agent, or Firm* — Foley & Lardner LLP

(57) ABSTRACT

A semiconductor device package and a method of manufacturing the same are provided. The semiconductor device package includes a circuit layer, a first package body, a first antenna and an electronic component. The circuit layer has a first surface and a second surface opposite to the first surface. The first package body is disposed on the first surface of the circuit layer. The first antenna penetrates the first package body and is electrically connected to the circuit layer. The electronic component is disposed on the second surface of the circuit layer.

20 Claims, 16 Drawing Sheets

US 10,964,652 B2

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an antenna and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. To reduce the cost and package size, Antenna-in-Package (AiP) technique is provided. However, due to the process constraint, it is difficult to integrate a dipole antenna in an AiP system.

SUMMARY

In accordance with some embodiments of the present disclosure, a semiconductor device package includes a circuit layer, a first package body, a first antenna and an electronic component. The circuit layer has a first surface and a second surface opposite to the first surface. The first package body is disposed on the first surface of the circuit layer. The first antenna penetrates the first package body and is electrically connected to the circuit layer. The electronic component is disposed on the second surface of the circuit layer.

In accordance with some embodiments of the present disclosure, a semiconductor device package includes a conductive layer, a first package body and a first conductive element. The conductive layer has a first surface and a second surface opposite to the first surface. The conductive layer has a first antenna on the first surface of the conductive layer. The first package body is disposed on the first surface of the conductive layer. The first conductive element penetrates the first package body and is electrically connected to a portion of the conductive layer to define a second antenna.

In accordance with some embodiments of the present disclosure, a method of manufacturing an optical module includes: (a) providing a carrier; (b) forming a first conductive layer having a first antenna over the carrier; (c) forming a conductive element on the first conductive layer; and (d) forming a first package body on the first conductive layer to cover the conductive element and to expose a top end of the conductive element. The conductive element and a portion of the first conductive layer define a second antenna.

Figure 1:
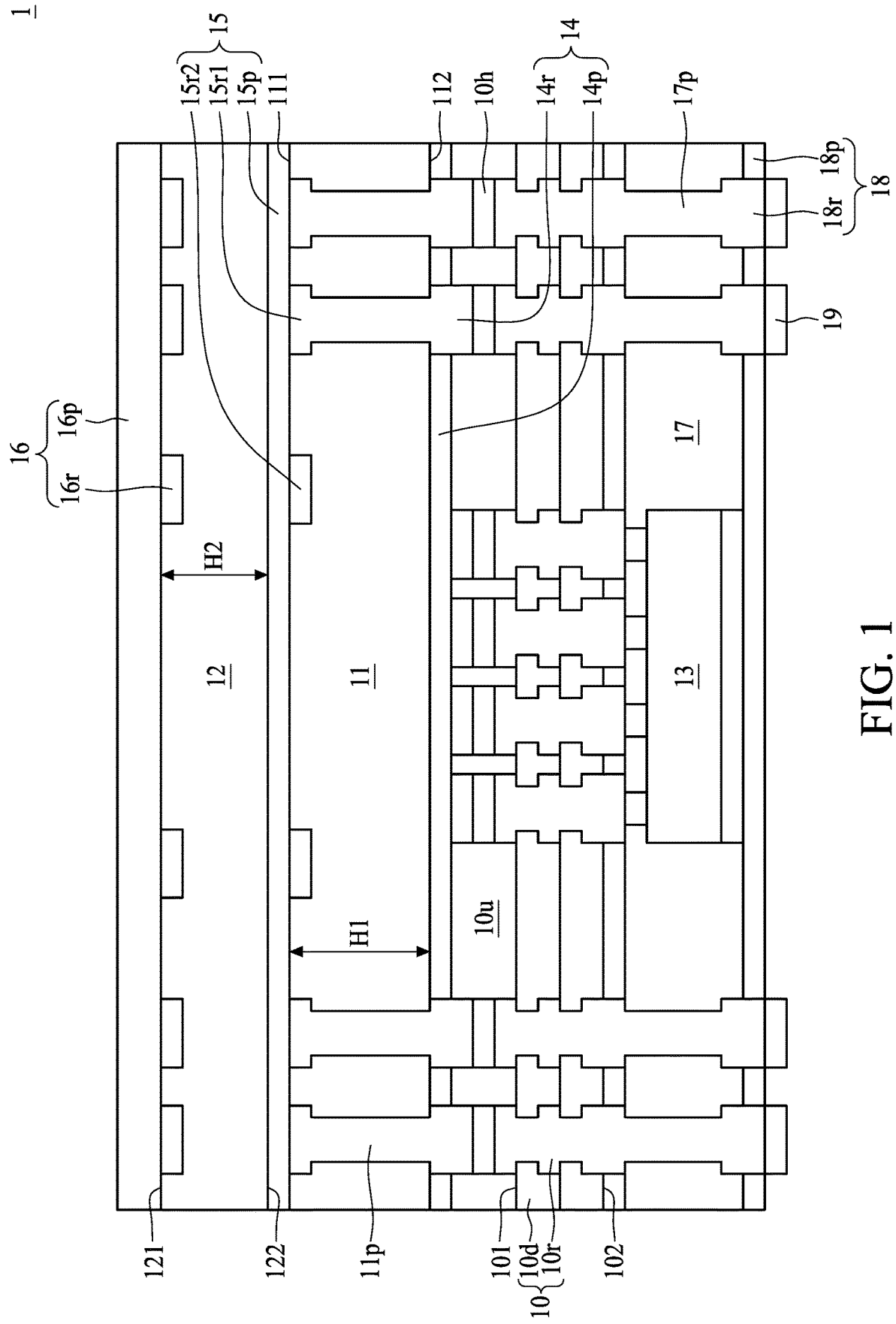
FIG. 1 illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1 illustrates a cross-sectional view of a semiconductor device package 1 in accordance with some embodiments of the present disclosure. The semiconductor device package 1 includes a circuit layer 10, package bodies 11, 12, 17, an electronic component 13 and conductive layers 14, 15, 16 and 18.

The circuit layer 10 includes one or more interconnection layers (e.g., redistribution layers, RDLs) 10r and one or more dielectric layers 10d. A portion of the interconnection layer 10r is covered or encapsulated by the dielectric layer 10d while another portion of the interconnection layer 10r is exposed from the dielectric layer 10d to provide electrical connections. The circuit layer 10 has a surface 101 and a surface 102 opposite to the surface 101.

In some embodiments, the dielectric layer 10d may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, there may be any number of interconnection layers 10r depending on design specifications. In some embodiments, the interconnection layer 10r is formed of or includes gold (Au), silver (Ag), copper (Cu), platinum (Pt), Palladium (Pd), other metal(s) or alloy(s), or a combination of two or more thereof.

The conductive layer 14 is disposed on the surface 101 of the circuit layer 10 and electrically connected to the interconnection layer 10r exposed from the dielectric layer 10d through a connection layer 10h (e.g., solder). The conductive layer 14 includes an interconnection layer 14r and a passivation layer 14p covering a portion of the interconnection layer 14r and exposing another portion of the interconnection layer 14r for electrical connections. In some embodiments, the passivation layer 14p includes silicon oxide, silicon nitride, gallium oxide, aluminum oxide, scandium oxide, zirconium oxide, lanthanum oxide or hafnium oxide. The interconnection layer 14r is, or includes, a conductive material such as a metal or metal alloy. Examples of the conductive material include Au, Ag, Cu, Pt, Pd, or an alloy thereof. In some embodiments, an underfill 10u is disposed between the circuit layer 10 and the conductive layer 14 to cover the interconnection layer 10r exposed from the dielectric layer 10d, the interconnection layer 14r exposed from the passivation layer 14p and the connection layer 10h.

The package body 11 is disposed on the conductive layer 14. The package body 11 has a surface 111 facing away from the conductive layer 14 and a surface 112 opposite to the surface 111. In some embodiments, the package body 11 includes an epoxy resin including fillers, a molding compound (e.g., an epoxy molding compound or other molding compound), a polyimide, a phenolic compound or material, a material including a silicone dispersed therein, or a combination thereof. One or more interconnection structure 11p (e.g., conductive pillars or conductive elements) penetrate the package body 11 to be electrically connected to the interconnection layer 14r of the conductive layer 14. The interconnection structure 11p is, or includes, a conductive material such as a metal or metal alloy. Examples of the conductive material include Au, Ag, Cu, Pt, Pd, or an alloy thereof.

The conductive layer 15 is disposed on the surface 111 of the package body 11 and electrically connected to the interconnection structure 11p. The conductive layer 15 includes interconnection layers 15r1, 15r2 and a passivation layer 15p. The interconnection layers 150 and 15r2 are disposed on a surface (which is in contact with the surface 111 of the package body 11) of the passivation layer 15p and covered by the package body 11. In some embodiments, the interconnection layer 15r1 is electrically connected to the interconnection structure 11p to define an antenna, such as a dipole antenna. In some embodiments, the passivation layer 15p includes silicon oxide, silicon nitride, gallium oxide, aluminum oxide, scandium oxide, zirconium oxide, lanthanum oxide or hafnium oxide. The interconnection layers 15r2, 15r2 are, or include, a conductive material such as a metal or metal alloy. Examples of the conductive material include Au, Ag, Cu, Pt, Pd, or an alloy thereof.

The package body 12 is disposed on the conductive layer 15. The package body 12 has a surface 121 facing away from the conductive layer 15 and a surface 122 opposite to the surface 121. In some embodiments, the package body 12 includes an epoxy resin including fillers, a molding compound (e.g., an epoxy molding compound or other molding compound), a polyimide, a phenolic compound or material, a material including a silicone dispersed therein, or a combination thereof.

In some embodiments, a thickness H1 of the package body 11 is greater than a thickness H2 of the package body 12. In some embodiments, a ratio of the thickness H1 of the package body 11 to the thickness H2 of the package body 12 is about 2:1. In some embodiments, the thickness H1 of the package body 11 is equal to or greater than 500 micrometer (μm).

The conductive layer 16 is disposed on the surface 121 of the package body 12. The conductive layer 16 includes an interconnection layer 16r and a passivation layer 16p. The interconnection layer 16r are disposed on a surface (which is in contact with the surface 121 of the package body 12) of the passivation layer 16p and covered by the package body 12. In some embodiments, the interconnection layer 16r defines an antenna, such as a patch antenna. For example, the interconnection layer 16r is coupled with the interconnection layer 15r2 for signal transmission therebetween. In some embodiments, the passivation layer 16p includes silicon oxide, silicon nitride, gallium oxide, aluminum oxide, scandium oxide, zirconium oxide, lanthanum oxide or hafnium oxide. The interconnection layer 16r is, or includes, a conductive material such as a metal or metal alloy. Examples of the conductive material include Au, Ag, Cu, Pt, Pd, or an alloy thereof.

The electronic component 13 is disposed on the surface 102 of the circuit layer 10. The electronic component 13 may be an active electronic component, such as an integrated circuit (IC) chip or a die. In some embodiments, the interconnection structure 10r (e.g., RDL) is directly connected to conductive terminals (e.g., copper pillars) of an active surface of the electronic component. In other embodiments, the electronic component 13 may be electrically connected to the circuit layer (e.g., to the interconnection layer 10r) by way of flip-chip or wire-bond techniques. In some embodiments, a backside surface of the electronic component 13 is bonded or attached to the passivation layer 18p of the conductive layer 18 through an adhesive layer (e.g., die attach film, DAF).

The package body 17 is disposed on the surface 102 of the circuit layer 10 and covers the electronic component 13. In some embodiments, the package body 17 includes an epoxy resin including fillers, a molding compound (e.g., an epoxy molding compound or other molding compound), a polyimide, a phenolic compound or material, a material including a silicone dispersed therein, or a combination thereof. One or more interconnection structure 17p (e.g., conductive pillars or conductive elements) penetrate the package body 17 to be electrically connected to the interconnection layer 10r of the circuit layer 10. The interconnection structure 17p is, or includes, a conductive material such as a metal or metal alloy. Examples of the conductive material include Au, Ag, Cu, Pt, Pd, or an alloy thereof.

The conductive layer 18 is disposed on a surface of the package body 17 facing away from the circuit layer 10. The conductive layer 14 has an interconnection layer 18r electrically connected to the interconnection structure 17p and a passivation layer 18p covering a portion the interconnection layer 18r. Another portion of the interconnection layer 18r is exposed from the passivation layer 18p for electrical connections. In some embodiments, electrical contacts 19 are disposed on the interconnection layer 18r exposed from the passivation layer 18p. In some embodiments, the passivation layer 18p includes silicon oxide, silicon nitride, gallium oxide, aluminum oxide, scandium oxide, zirconium oxide, lanthanum oxide or hafnium oxide. The interconnection layer 18r is, or includes, a conductive material such as a metal or metal alloy. Examples of the conductive material include Au, Ag, Cu, Pt, Pd, or an alloy thereof.

In an AiP system, a height of a dipole antenna is relevant to the performance of the dipole antenna. In some embodiments, a dipole antenna with a height equal to or greater than 500 μm may meet the specification for high performance. In some embodiments, a dipole antenna in an AiP system can be achieved by forming one or more conductive vias penetrating a glass substrate (e.g., through glass via, TGV). However, the manufacturing cost to form TGVs is relatively high, and the thickness of the glass substrate is less than 300 μm. In other embodiments, a dipole antenna in an AiP system can be achieved by forming one or more conductive vias penetrating a silicon substrate (e.g., through silicon via, TSV). However, to form TSVs with a desired height, a multi-layer substrate should be used, which will increase the manufacturing cost and the total thickness of the device package. In accordance with the embodiments shown in FIG. 1, the interconnection structure 11*p* penetrates the package body 11 (through molding via, TMV) to define a dipole antenna with the thickness equal to or more than 500 µm, a dipole antenna with the high performance can be achieved.

Figure 2:
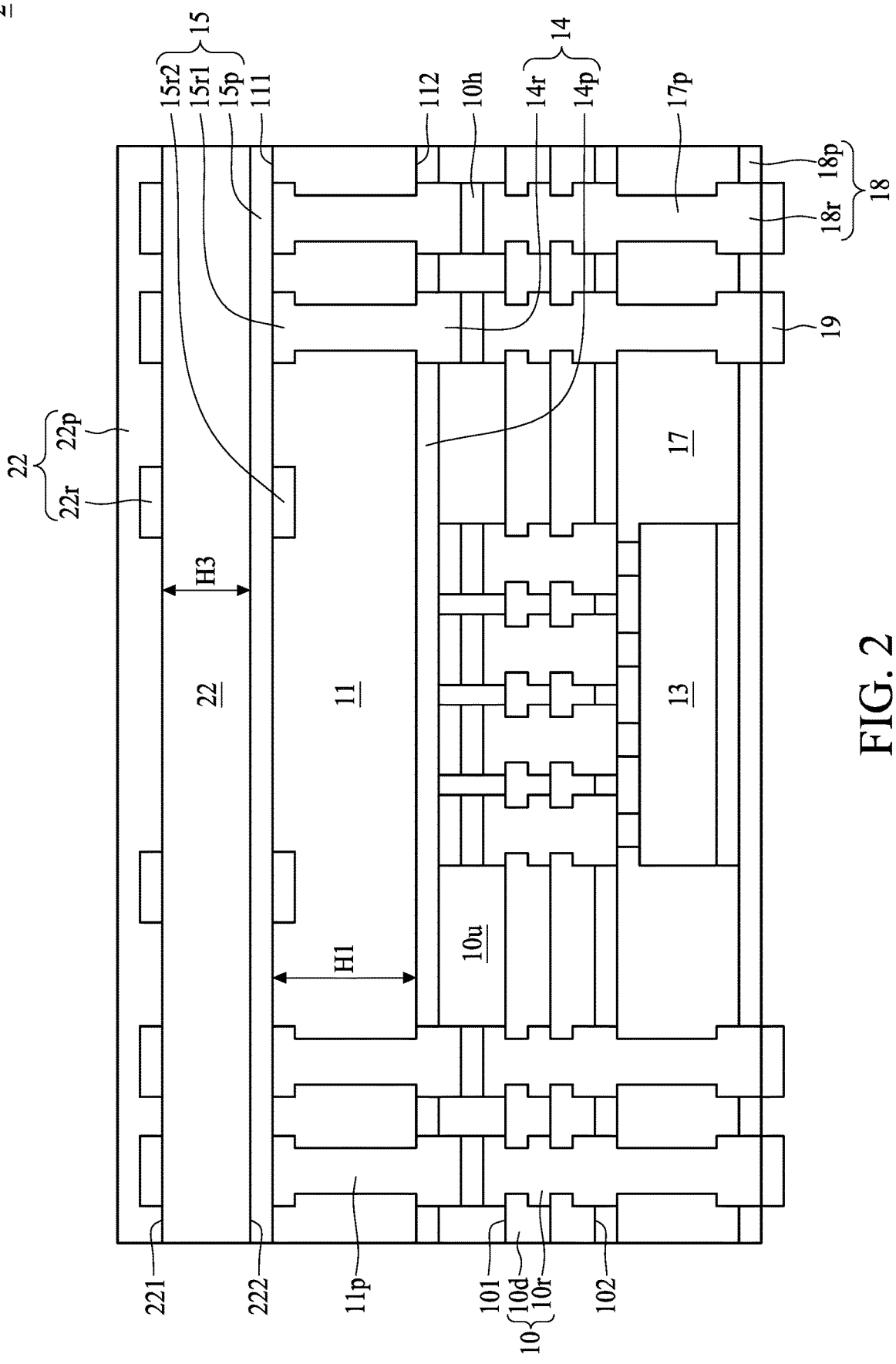
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1, and one of the differences is that in FIG. 2, the package body 12 is replaced by a glass substrate 22.

The glass substrate 22 is disposed on the conductive layer 15. The glass substrate 22 has a surface 221 facing away from the circuit layer 15 and a surface 222 opposite to the surface 221. In some embodiments, the thickness H1 of the package body 11 is greater than a thickness H3 of the glass substrate 22. In some embodiments, a ratio of the thickness H1 of the package body 11 to the thickness H3 of the glass substrate is about 2:1.

An interconnection layer 22*r* is disposed on the surface 221 of the glass substrate 22. In some embodiments, the interconnection layer 22*r* defines an antenna, such as a patch antenna. The interconnection layer 22*r* is, or includes, a conductive material such as a metal or metal alloy. Examples of the conductive material include Au, Ag, Cu, Pt, Pd, or an alloy thereof.

A passivation layer 22*p* is disposed on the surface 221 of the glass substrate 22 to cover the interconnection layer 22*r*. In some embodiments, the passivation layer 22*p* includes silicon oxide, silicon nitride, gallium oxide, aluminum oxide, scandium oxide, zirconium oxide, lanthanum oxide or hafnium oxide.

Figure 3:
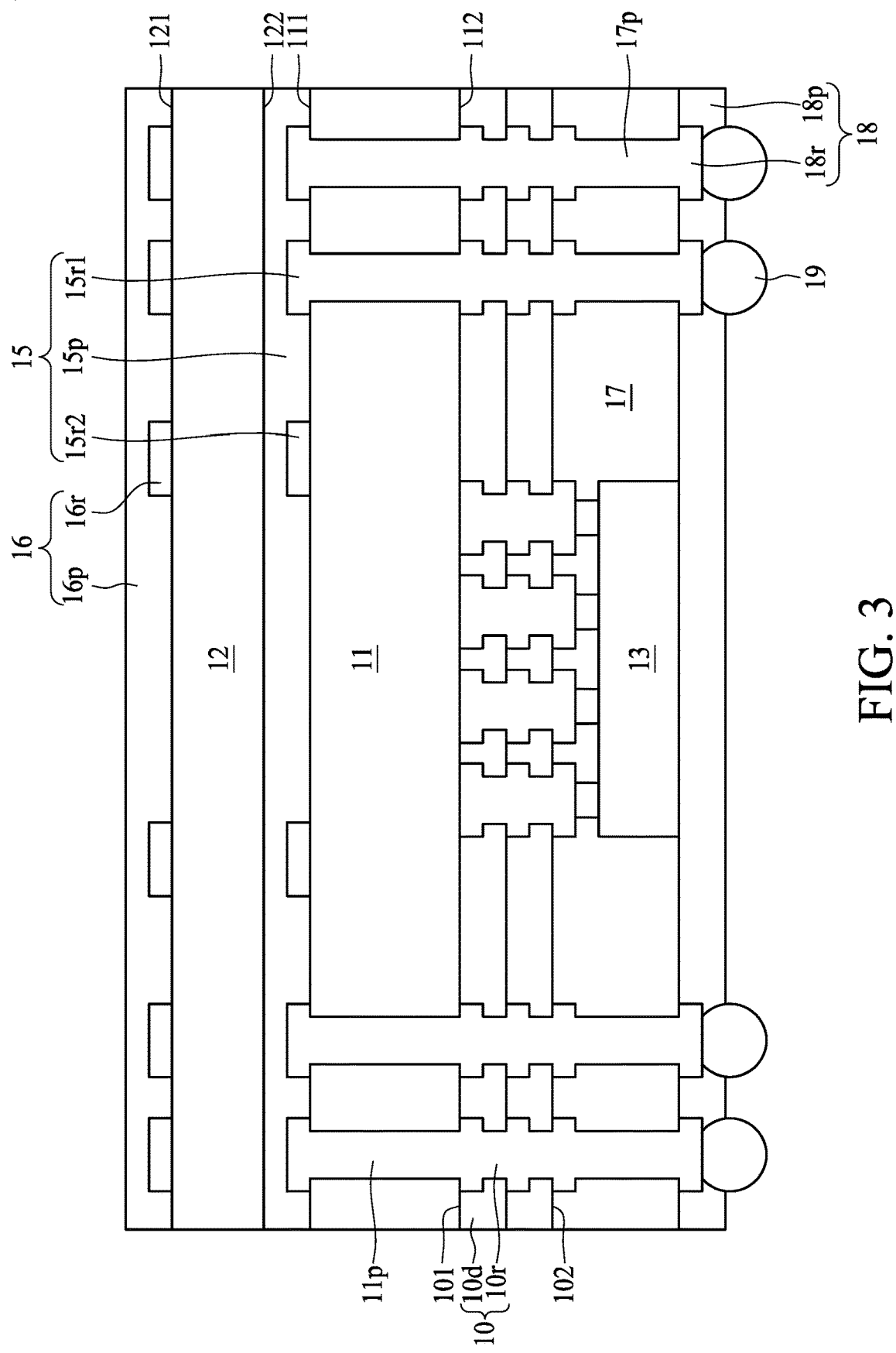
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 in FIG. 1, and the differences therebetween are described below.

The package body 11 is disposed on the surface 101 of the circuit layer 10. In some embodiments, the package body 11 is in contact with the circuit layer 10. The package body 11 has a surface 111 facing away from the circuit layer 10 and a surface 112 opposite to the surface 111. In some embodiments, the package body 11 includes an epoxy resin including fillers, a molding compound (e.g., an epoxy molding compound or other molding compound), a polyimide, a phenolic compound or material, a material including a silicone dispersed therein, or a combination thereof.

One or more interconnection structure 11*p* (e.g., conductive pillars or conductive elements) penetrate the package body 11 to be electrically connected to the interconnection layer 10*r* of the circuit layer 10. In some embodiments, the interconnection structure 11*p* is directly connected to the interconnection layer 10*r* of the circuit layer 10, and the connection layer 10*h* and the underfill 10*u* illustrated in FIG. 1 can be omitted. The interconnection structure 11*p* is, or includes, a conductive material such as a metal or metal alloy. Examples of the conductive material include Au, Ag, Cu, Pt, Pd, or an alloy thereof.

The conductive layer 15 is disposed on the surface 111 of the package body 11 and electrically connected to the interconnection structure 11*p*. The conductive layer 15 includes interconnection layers 15*r*1, 15*r*2 and a passivation layer 15*p*. The interconnection layers 150 and 15*r*2 are disposed on the surface 111 of the package body 11 and covered by the passivation layer 15*p*. In some embodiments, the interconnection layer 150 is electrically connected to the interconnection structure 11*p* to define an antenna, such as a dipole antenna. In some embodiments, the passivation layer 15*p* includes silicon oxide, silicon nitride, gallium oxide, aluminum oxide, scandium oxide, zirconium oxide, lanthanum oxide or hafnium oxide. The interconnection layers 15*r*2, 15*r*2 are, or include, a conductive material such as a metal or metal alloy. Examples of the conductive material include Au, Ag, Cu, Pt, Pd, or an alloy thereof.

The conductive layer 16 is disposed on the surface 121 of the package body 12. The conductive layer 16 includes an interconnection layer 16*r* and a passivation layer 16*p*. The interconnection layer 16*r* are disposed on the surface 121 of the package body 12 and covered by the passivation layer 16*p*. In some embodiments, the interconnection layer 16*r* defines an antenna, such as a patch antenna. For example, the interconnection layer 16*r* is coupled with the interconnection layer 15*r*2 for signal transmission therebetween. In some embodiments, the passivation layer 16*p* includes silicon oxide, silicon nitride, gallium oxide, aluminum oxide, scandium oxide, zirconium oxide, lanthanum oxide or hafnium oxide. The interconnection layer 16*r* is, or includes, a conductive material such as a metal or metal alloy. Examples of the conductive material include Au, Ag, Cu, Pt, Pd, or an alloy thereof.

Figure 4:
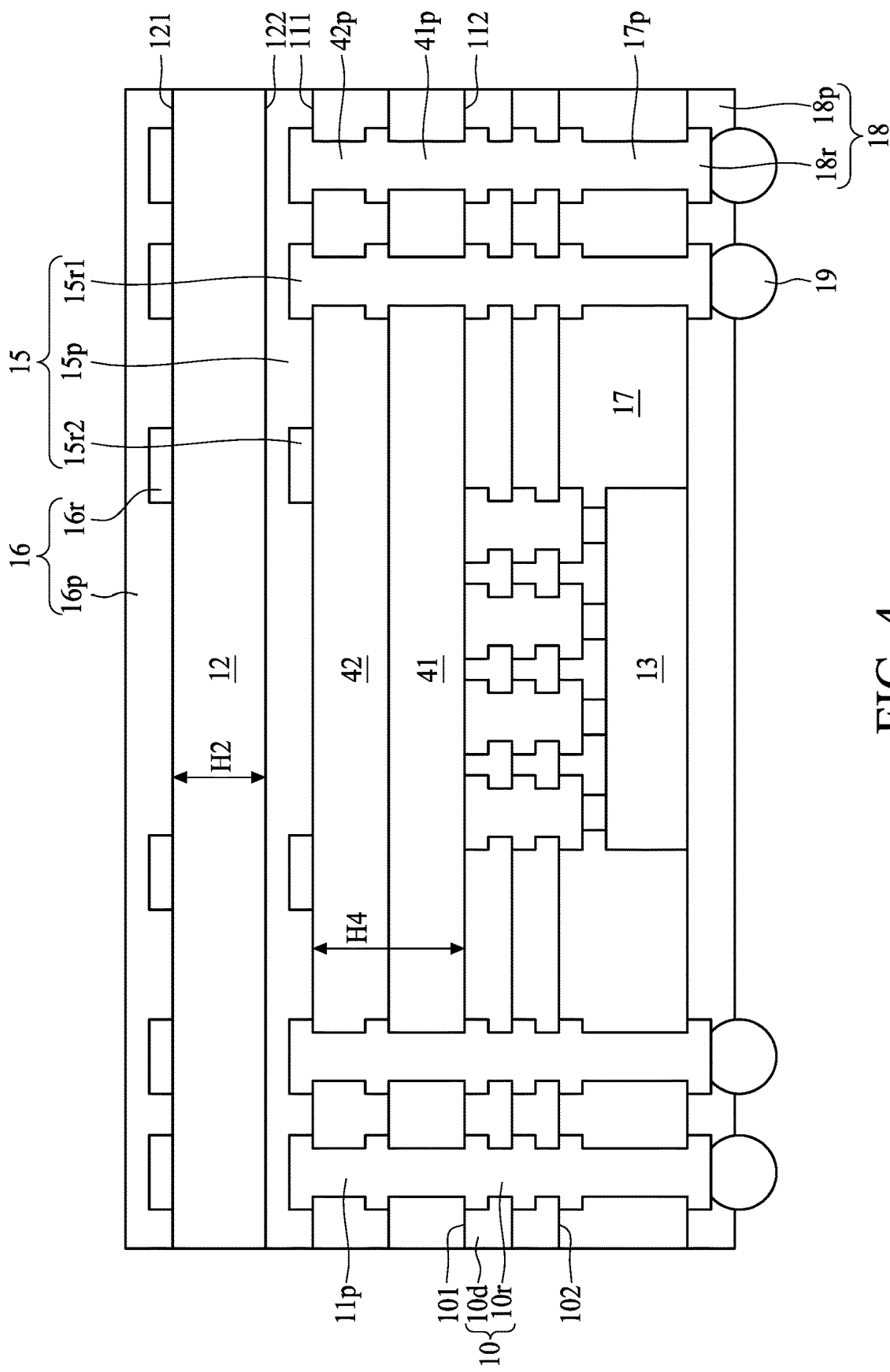
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 3 in FIG. 3, except that the package body 11 in FIG. 3 can be implemented by using two package bodies 41 and 42.

The package body 41 is disposed on the surface 101 of the circuit layer 10. In some embodiments, the package body 41 includes an epoxy resin including fillers, a molding compound (e.g., an epoxy molding compound or other molding compound), a polyimide, a phenolic compound or material, a material including a silicone dispersed therein, or a combination thereof. One or more interconnection structure 41*p* (e.g., conductive pillars or conductive elements) penetrate the package body 41 to be electrically connected to the interconnection layer 10*r* of the circuit layer 10. The interconnection structure 41*p* is, or includes, a conductive material such as a metal or metal alloy. Examples of the conductive material include Au, Ag, Cu, Pt, Pd, or an alloy thereof.

The package body 42 is disposed on the package body 41. The package body 42 is in contact with the package body 41. In some embodiments, the package body 42 includes an epoxy resin including fillers, a molding compound (e.g., an epoxy molding compound or other molding compound), a polyimide, a phenolic compound or material, a material including a silicone dispersed therein, or a combination thereof. One or more interconnection structure 42*p* (e.g., conductive pillars or conductive elements) penetrate the package body 42 to be electrically connected to the interconnection structure 41*p* and the interconnection layer 150. In some embodiments, the interconnection layer 15*r*1, the interconnection structures 41*p* and 42*p* are electrically connected to define an antenna, such as a dipole antenna. The interconnection structure 42*p* is, or includes, a conductive material such as a metal or metal alloy. Examples of the conductive material include Au, Ag, Cu, Pt, Pd, or an alloy thereof.

In some embodiments, a sum H4 of the thickness of the package body 41 and the thickness of the package body 42 is greater than the thickness H2 of the package body 12. In some embodiments, a ratio of the sum H4 of the thickness of the package body 41 and the thickness of the package body 42 to the thickness H2 of the package body 12 is about 2:1. In some embodiments, the sum H4 of the thickness of the package body 41 and the thickness of the package body 42 is equal to or greater than 500 μm.

Figure 5:
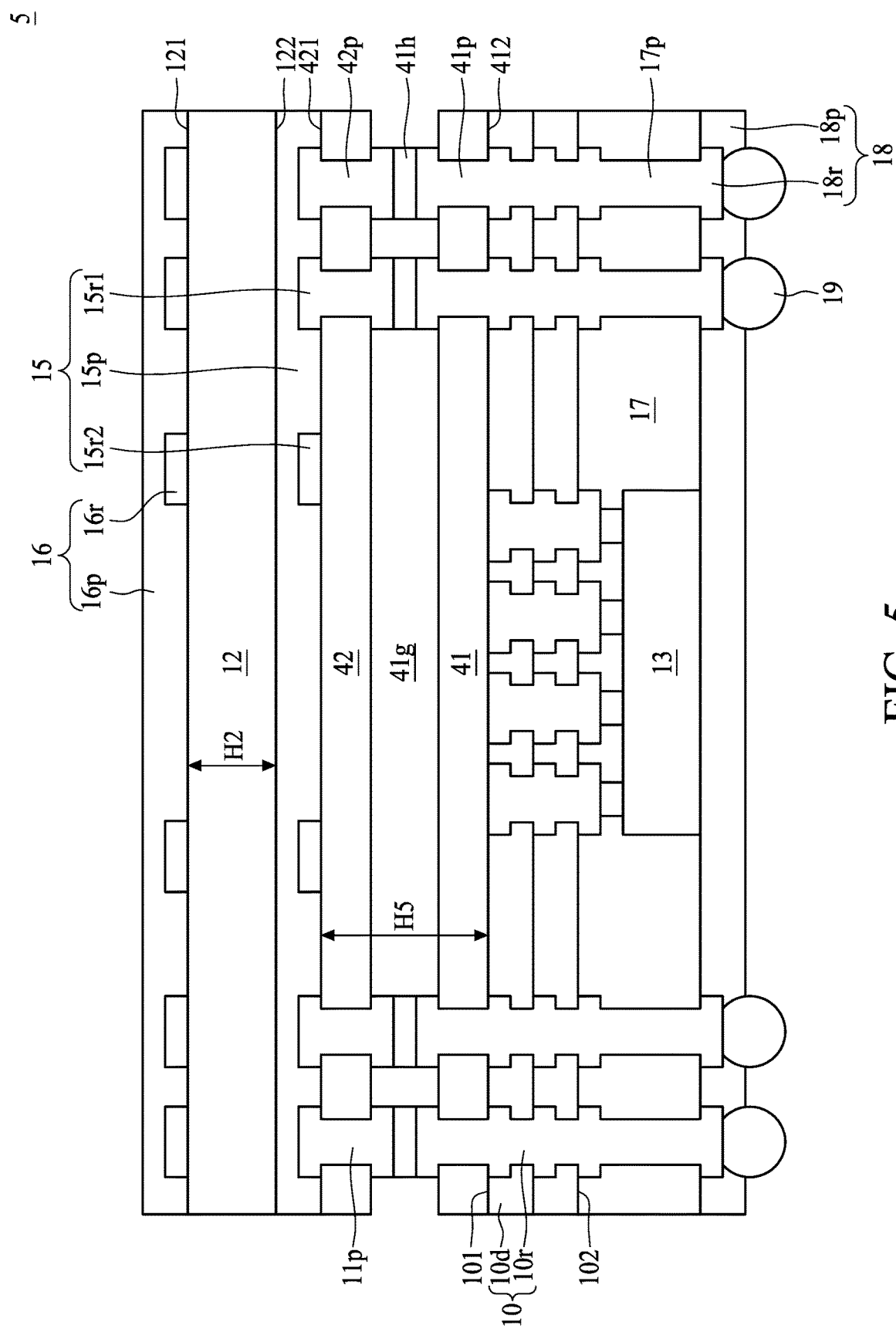
FIG. 5 illustrates a cross-sectional view of a semiconductor device package in accordance with some embodiments of the present disclosure.

FIG. 5 illustrates a cross-sectional view of a semiconductor device package 5 in accordance with some embodiments of the present disclosure. The semiconductor device package 5 is similar to the semiconductor device package 4 in FIG. 4, except that in FIG. 5, the package body 41 is spaced apart from the package body 42 through an air gap 41*g*.

The interconnection structure 41*p* is electrically connected to the interconnection structure 42*p* through a connection layer 41*h* (e.g., solder). In some embodiments, the interconnection layer 15*r*1, the interconnection structures 41*p*, 42*p* and the connection layer 41*h* are electrically connected to define an antenna, such as a dipole antenna.

In some embodiments, a distance H5 between a surface 421 of the package body 42 and a surface 412 of the package body 41 is greater than the thickness H2 of the package body 12. In some embodiments, a ratio of the distance H5 to the thickness H2 of the package body 12 is about 2:1. In some embodiments, the distance H5 is equal to or greater than 500 μm.

Figure 6A:
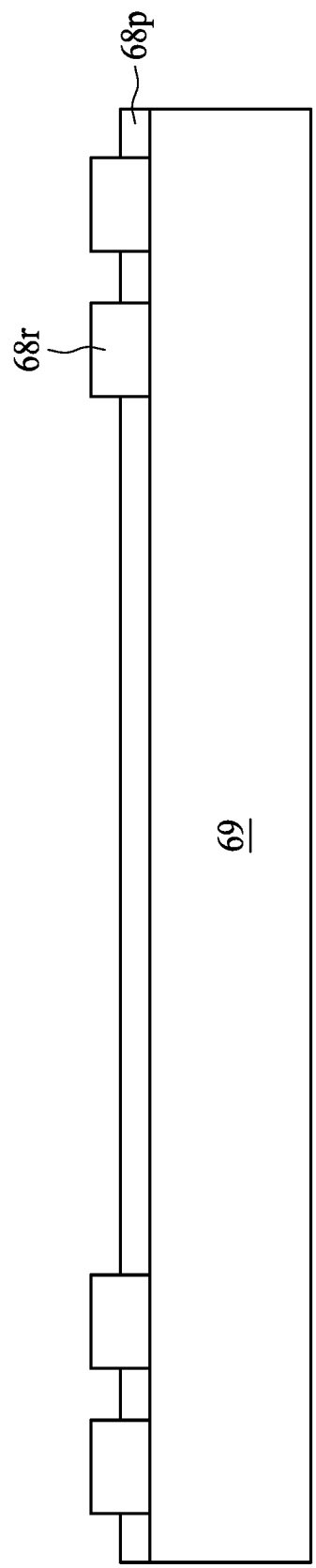
FIG. 6A, FIG. 6B and FIG. 6C illustrate a semiconductor manufacturing method in accordance with some embodiments of the present disclosure.
Figure 6B:
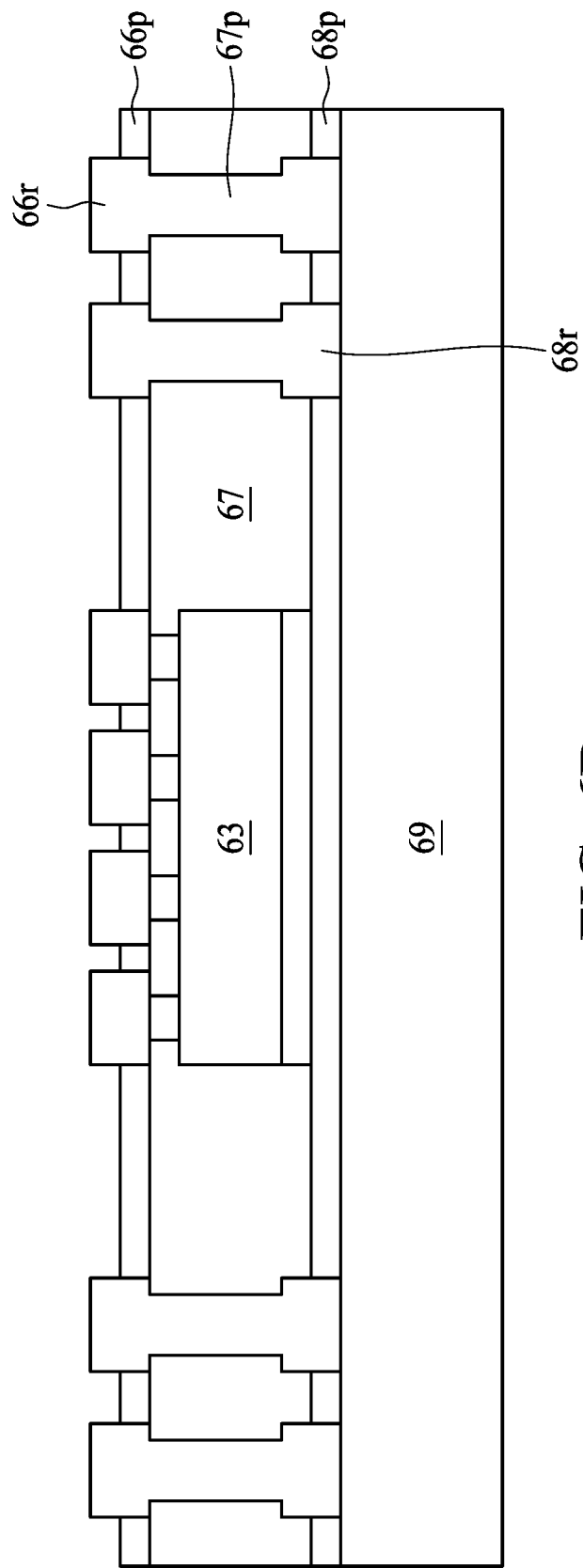
Figure 6C:
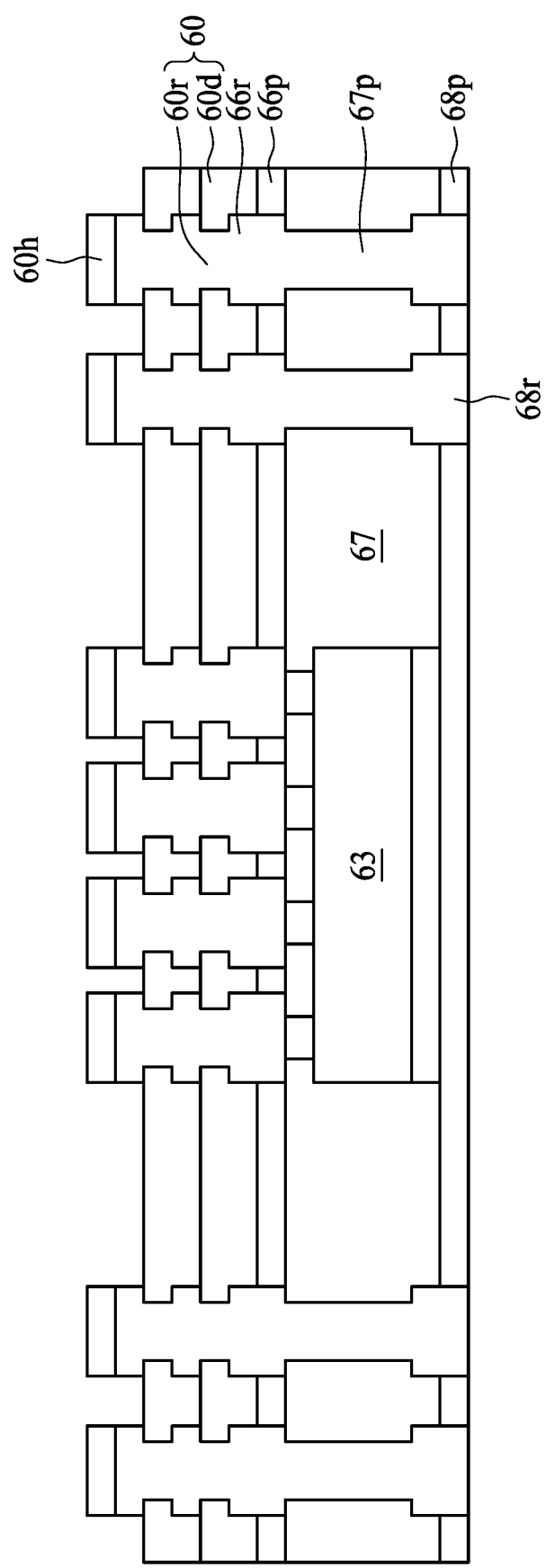

FIG. 6A, FIG. 6B and FIG. 6C illustrate a semiconductor manufacturing method in accordance with some embodiments of the present disclosure.

Referring to FIG. 6A, a carrier 69 is provided. In some embodiments, the carrier 69 is a glass carrier. An interconnection layer 68*r* is formed on the carrier 69 and then a passivation layer 68*p* is formed on the carrier 69. The passivation layer 68*p* covers a portion of the interconnection layer 68*r* and expose another portion of the interconnection layer 68*r* for electrical connections.

Referring to FIG. 6B, one or more interconnection structures 67*p* (e.g., conductive pillars) are formed on the interconnection layer 68*r* and electrically connected to the portion of the interconnection layer 68*r* exposed from the passivation layer 68*p*. An electronic component 63 is disposed on the passivation layer 68*p*. A backside surface of the electronic component 63 is attached to the passivation layer 68*p*.

Still referring to FIG. 6B, a package body 67 is formed or disposed on the passivation layer 68*p* and encapsulates the electronic component 63 and the interconnection structure 67*p*. The package body 67 may be formed or disposed by a molding technique, such as transfer molding or compression molding. In some embodiments, the package body 67 may be formed to fully cover the electronic component 63 and the interconnection structure 67*p*, and then a portion of the package body 67 is removed to expose a top terminal of the interconnection structure 67*p* and an active surface of the electronic component 63 by, for example, grinding.

Stilling referring to FIG. 6B, an interconnection layer 66*r* is formed on the package body 67 and electrically connected to the portion of the interconnection structure 67*p* and the active surface of the electronic component 63 that are exposed from the passivation layer 68*p*. A passivation layer 66*p* is formed on the package body 67 and covers a portion of the interconnection layer 66*r* and expose another portion of the interconnection layer 66*r* for electrical connections.

Referring to FIG. 6C, a circuit layer 60 is formed on the passivation layer 68*p* and electrically connected to the portion of the interconnection layer 68*r* exposed from the passivation layer 68*p*. The circuit layer 60 includes an interconnection layer 60*r* and a dielectric layer 60*d* covering a portion of the interconnection layer 60*r*. In some embodiments, there may be any number of interconnection layers 60*r* depending on design specifications. A connection layer 60*h* (e.g., solder or under bump metallization, UBM) is formed on the interconnection layer 60*r* exposed from the dielectric layer 60*d*. The carrier 69 is then removed to expose the interconnection layer 68*r* and the passivation layer 68*p*.

FIG. 7A, FIG. 7B, FIG. 7C and FIG. 7D illustrate a semiconductor manufacturing method in accordance with some embodiments of the present disclosure. In some embodiments, the method in FIG. 7A, FIG. 7B, FIG. 7C and FIG. 7D can be used to manufacture the semiconductor device package 1 in FIG. 1.

Figure 7A:
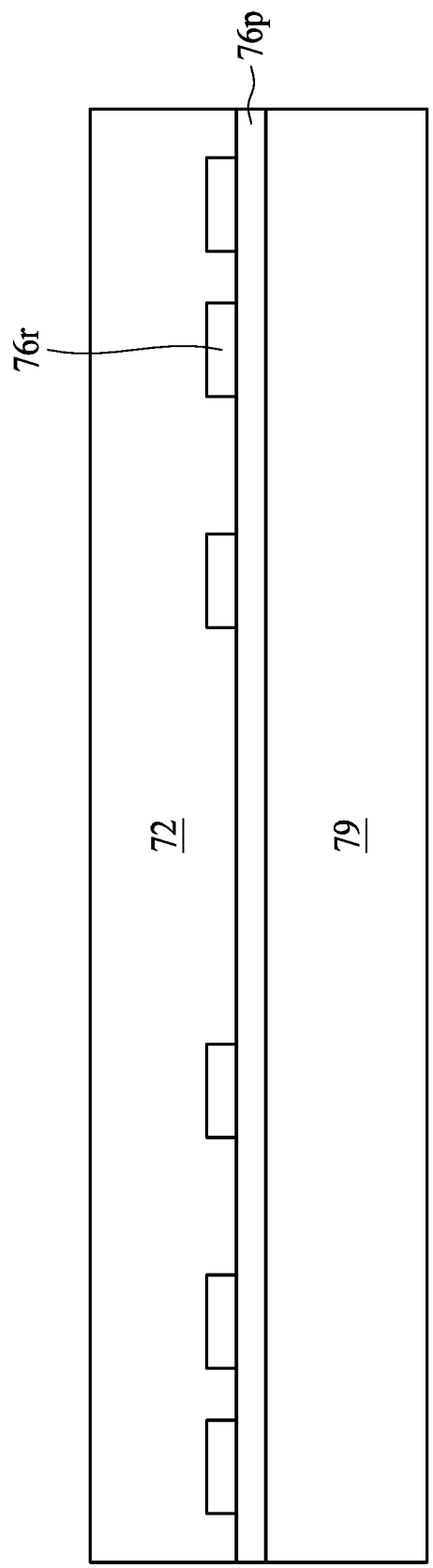
FIG. 7A, FIG. 7B, FIG. 7C and FIG. 7D illustrate a semiconductor manufacturing method in accordance with some embodiments of the present disclosure.

Referring to FIG. 7A, a carrier 79 is provided. In some embodiments, the carrier 79 is a glass carrier. A passivation layer 76*p* is formed on the carrier 79. An interconnection layer 76*r* is formed on the passivation layer 76*p*. In some embodiments, the interconnection layer 76*r* defines an antenna, such as a patch antenna. A package body 72 is then formed or disposed on the passivation layer 76*p* and encapsulates the interconnection layer 76*r*. The package body 72 may be formed or disposed by a molding technique, such as transfer molding or compression molding.

Figure 7B:
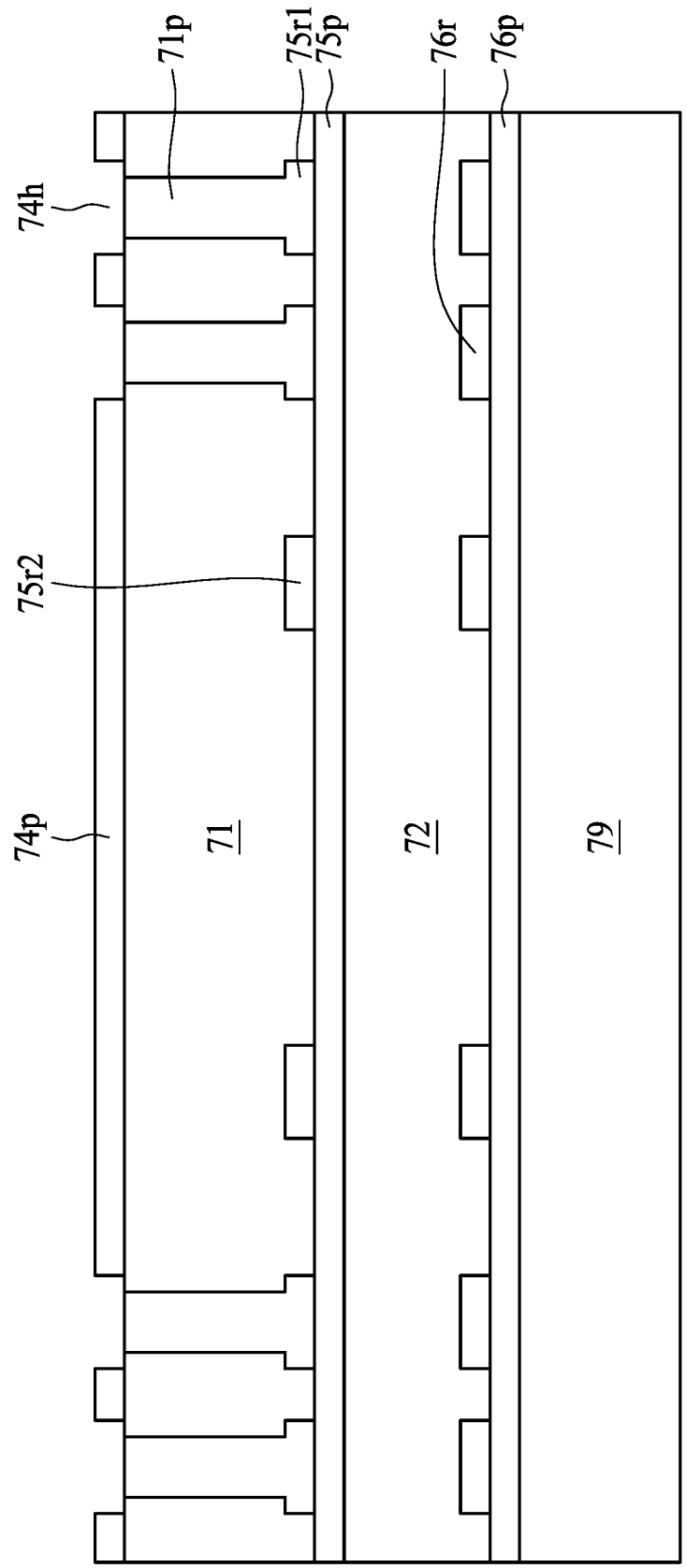

Referring to FIG. 7B, a passivation layer 75*p* is formed on the package body 72. Interconnection layers 75*r*1 and 75*r*2 are formed on the passivation layer 75*p*. In some embodiments, an interconnection structure 71*p* (e.g., conductive pillar) is formed on the interconnection layer 75*r*1 and electrically connected to the interconnection 75*r*1, and then a package body 71 is formed on the passivation layer 75*p* to cover the interconnection layers 75*r*1, 75*r*2 and the interconnection structure 71*p*. The package body 71 is then thinned to expose a top portion of the interconnection structure 71*p* for electrical connections. In other embodiments, the package body 71 is formed on the passivation layer 75*p*, through holes are formed to penetrate the package body 71 to expose the interconnection layer 75*r*1, and then the interconnection structure 71*p* is formed within the through holes.

Still referring to FIG. 7B, a passivation layer 74*p* is formed on the package body 71. One or more openings 74*h* are formed to penetrate the passivation layer 74*p* to expose the top portion of the interconnection structure 71*p* that is exposed from the package body 71.

Figure 7C:
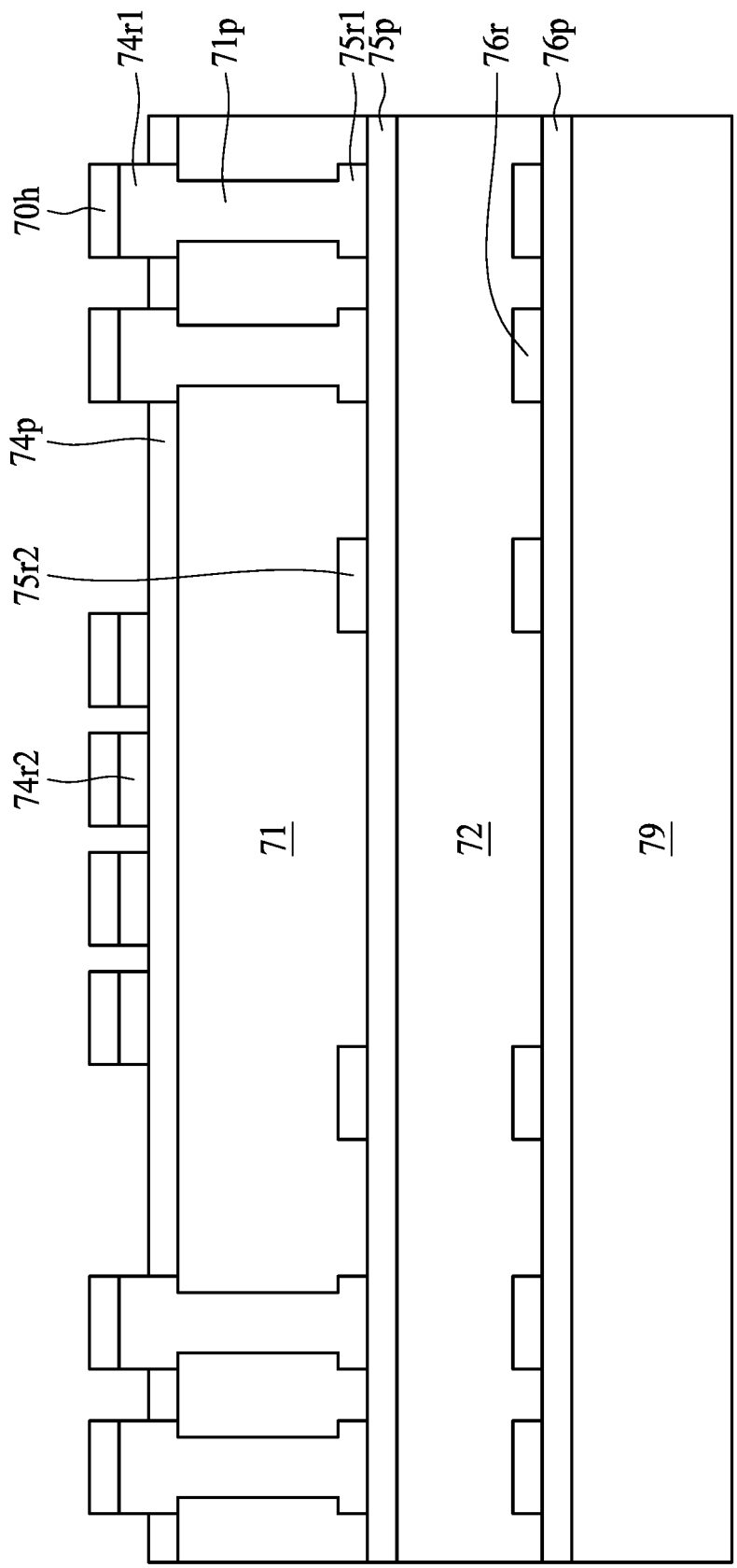

Referring to FIG. 7C, an interconnection layer 74*r*1 is formed within the openings 74*h* to be electrically connected to the interconnection structure 71*p*, and an interconnection layer 74*r*2 is formed on the passivation layer 74*p*. A connection layer 70*h* (e.g., solder or UBM) is then formed on the interconnection layers 74*r*1 and 74*r*2.

Figure 7D:
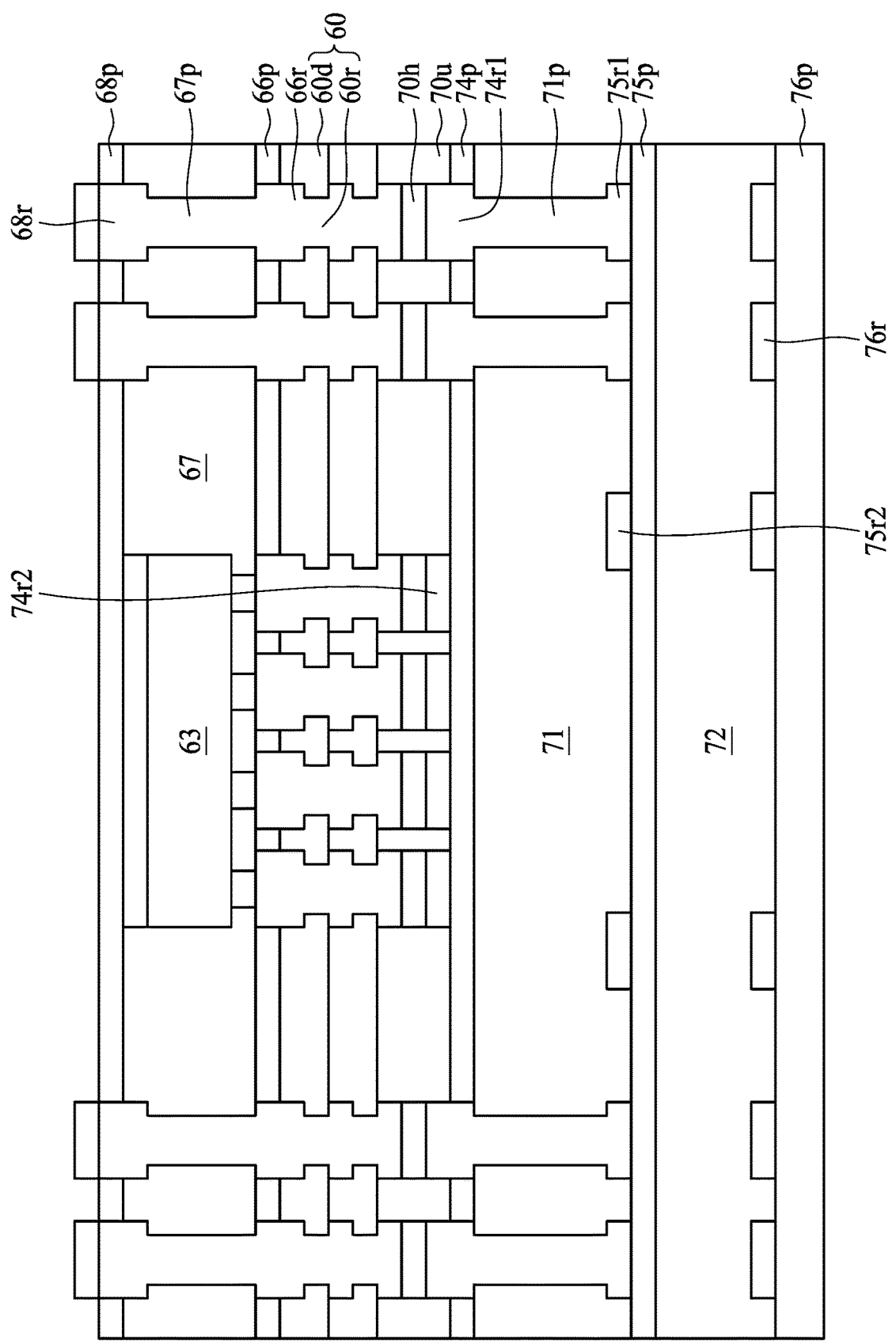

Referring to FIG. 7D, the device package illustrated in FIG. 6C is disposed on the interconnection layers 74*r*1 and 74*r*2. In some embodiments, the connection layer 70*h* is disposed the connection layer 60*h* of the device package illustrated in FIG. 6C, and then the connection layer 70*h* is attached to the connection layer 60*h* after reflow process. In some embodiments, the device package in FIG. 6C is bonded to device package in FIG. 7C by, for example, flip-chip technique. An underfill 70*u* may be formed between the device package in FIG. 6C and the device package in FIG. 7C to cover the interconnection layers 74*r*1, 74*r*2, 60*r* and connection layers 60*h*, 70*h*. Then, the carrier 79 is removed from the passivation layer 76*p* to form the semiconductor device package 1 as shown in FIG. 1.

FIG. 8A, FIG. 8B, FIG. 8C and FIG. 8D illustrate a semiconductor manufacturing method in accordance with some embodiments of the present disclosure. In some embodiments, the method in FIG. 8A, FIG. 8B, FIG. 8C and FIG. 8D can be used to manufacture the semiconductor device package 2 in FIG. 2.

Figure 8A:
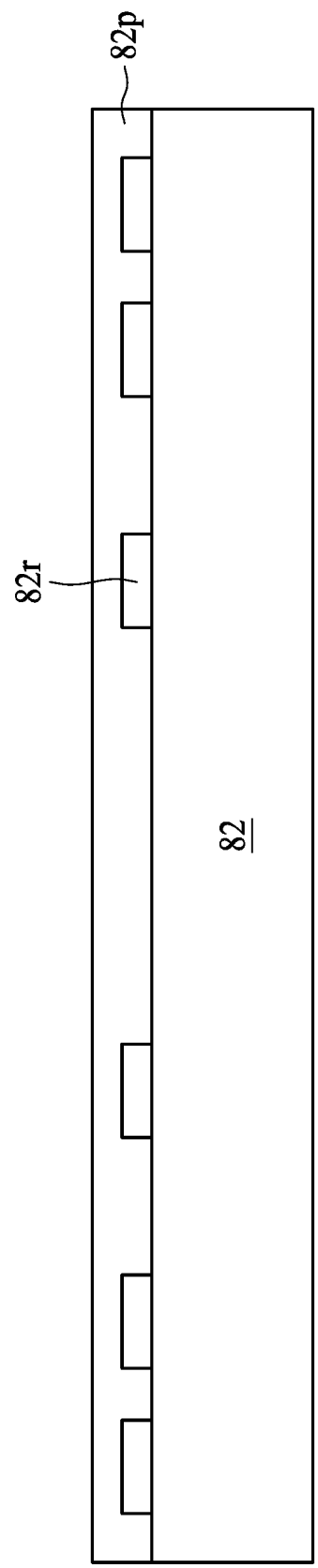
FIG. 8A, FIG. 8B, FIG. 8C and FIG. 8D illustrate a semiconductor manufacturing method in accordance with some embodiments of the present disclosure.

Referring to FIG. 8A, a glass substrate 82 is provided. An interconnection layer 82r is formed on the glass substrate 82, and then a passivation layer 82p is formed on the glass substrate 82 to cover the interconnection layer 82r. In some embodiments, the interconnection layer 82r defines an antenna, such as a patch antenna.

Figure 8B:
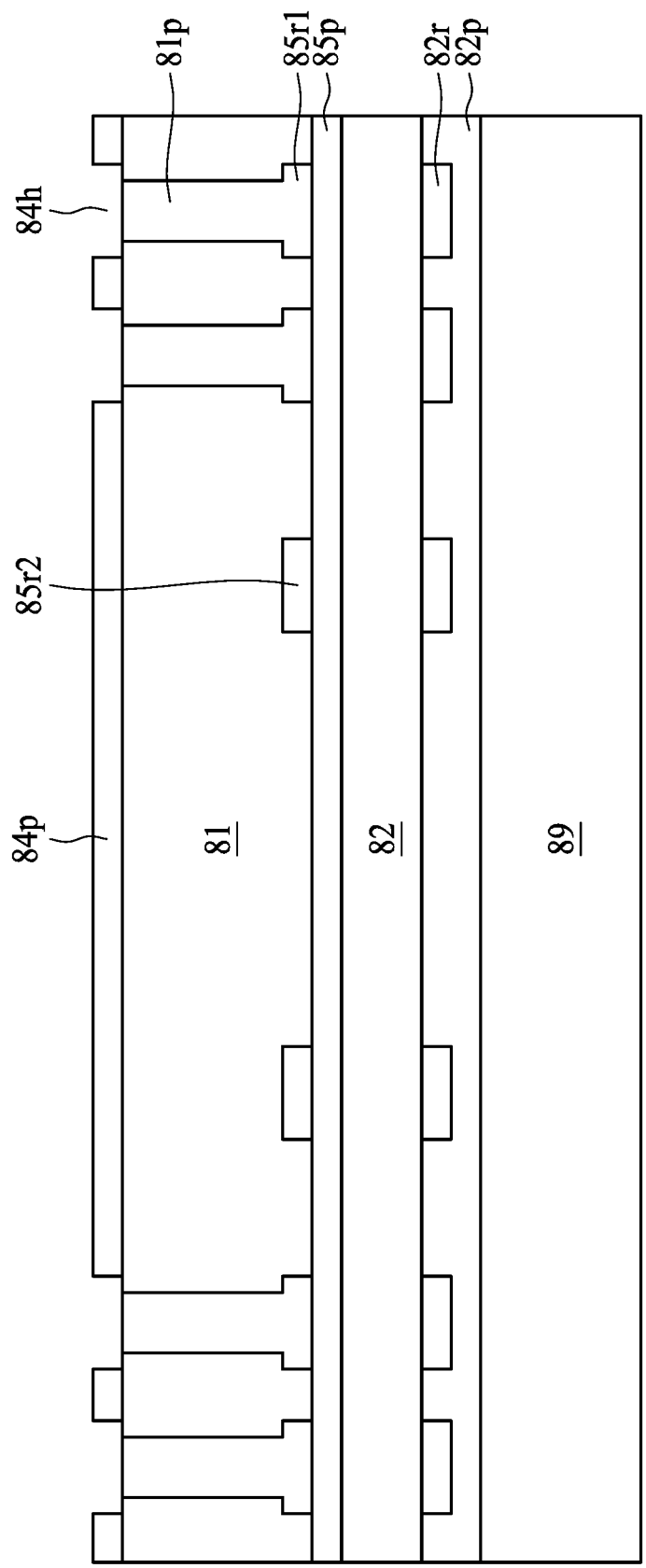

Referring to FIG. 8B, a carrier 89 is provided. In some embodiments, the carrier 89 is a glass carrier. The passivation layer 82p is disposed on the carrier 89. In some embodiments, a portion of the glass substrate 82 is removed to reduce the thickness of the glass substrate 82. A passivation layer 85p is formed on the glass substrate 82, and then conductive layers 85r1 and 85r2 are formed on the passivation layer 85p.

In some embodiments, an interconnection structure 81p (e.g., conductive pillar) is formed on the interconnection layer 85r1 and electrically connected to the interconnection 85r1, and then a package body 81 is formed on the passivation layer 85p to cover the interconnection layers 85r1, 85r2 and the interconnection structure 81p. The package body 81 is then thinned to expose a top portion of the interconnection structure 81p for electrical connections. In other embodiments, the package body 81 is formed on the passivation layer 85p, through holes are formed to penetrate the package body 81 to expose the interconnection layer 85r1, and then the interconnection structure 81p is formed within the through holes.

Still referring to FIG. 8B, a passivation layer 84p is formed on the package body 81. One or more openings 84h are formed to penetrate the passivation layer 84p to expose the top portion of the interconnection structure 81p that is exposed from the package body 81.

Figure 8C:
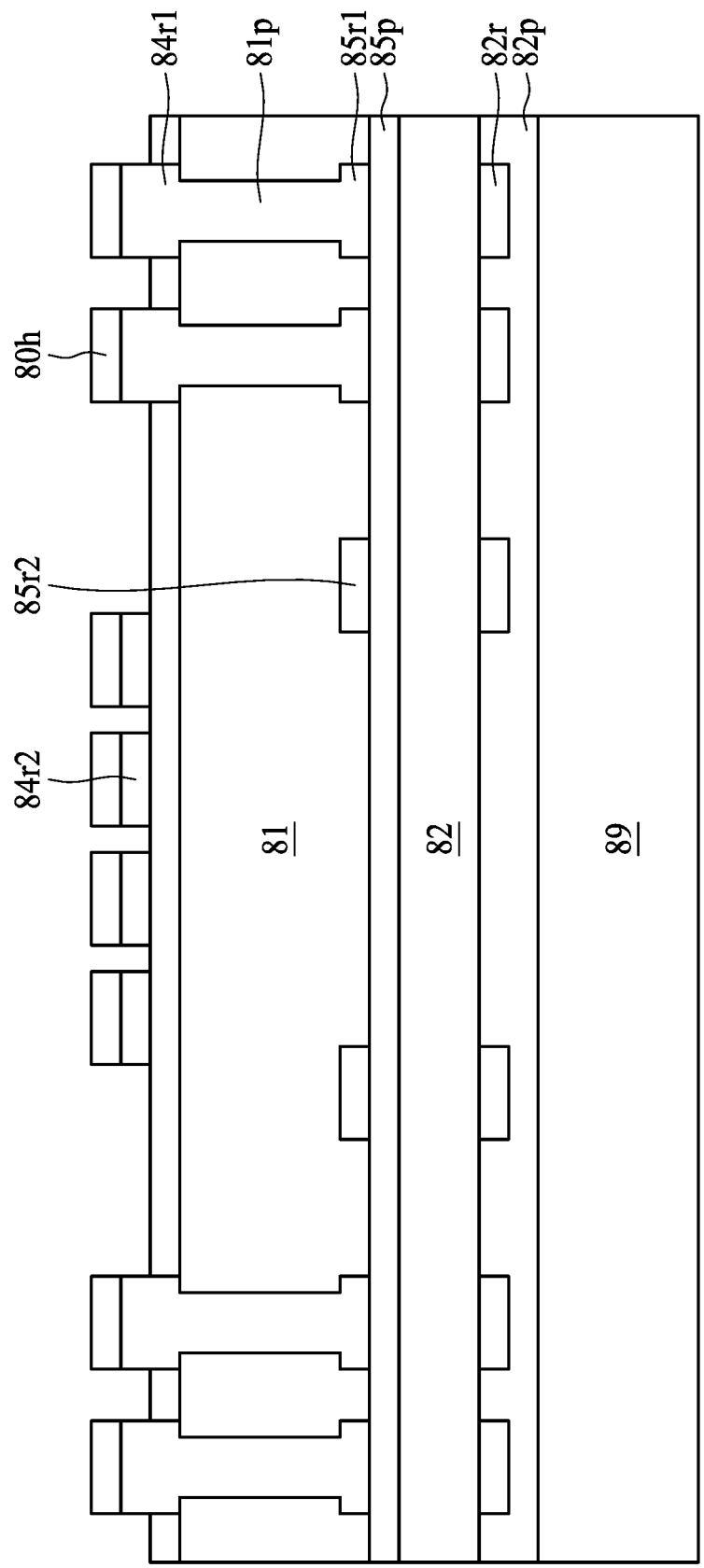

Referring to FIG. 8C, an interconnection layer 84r1 is formed within the openings 84h to be electrically connected to the interconnection structure 81p, and an interconnection layer 84r2 is formed on the passivation layer 84p. A connection layer 80h (e.g., solder or UBM) is then formed on the interconnection layers 84r1 and 84r2.

Figure 8D:
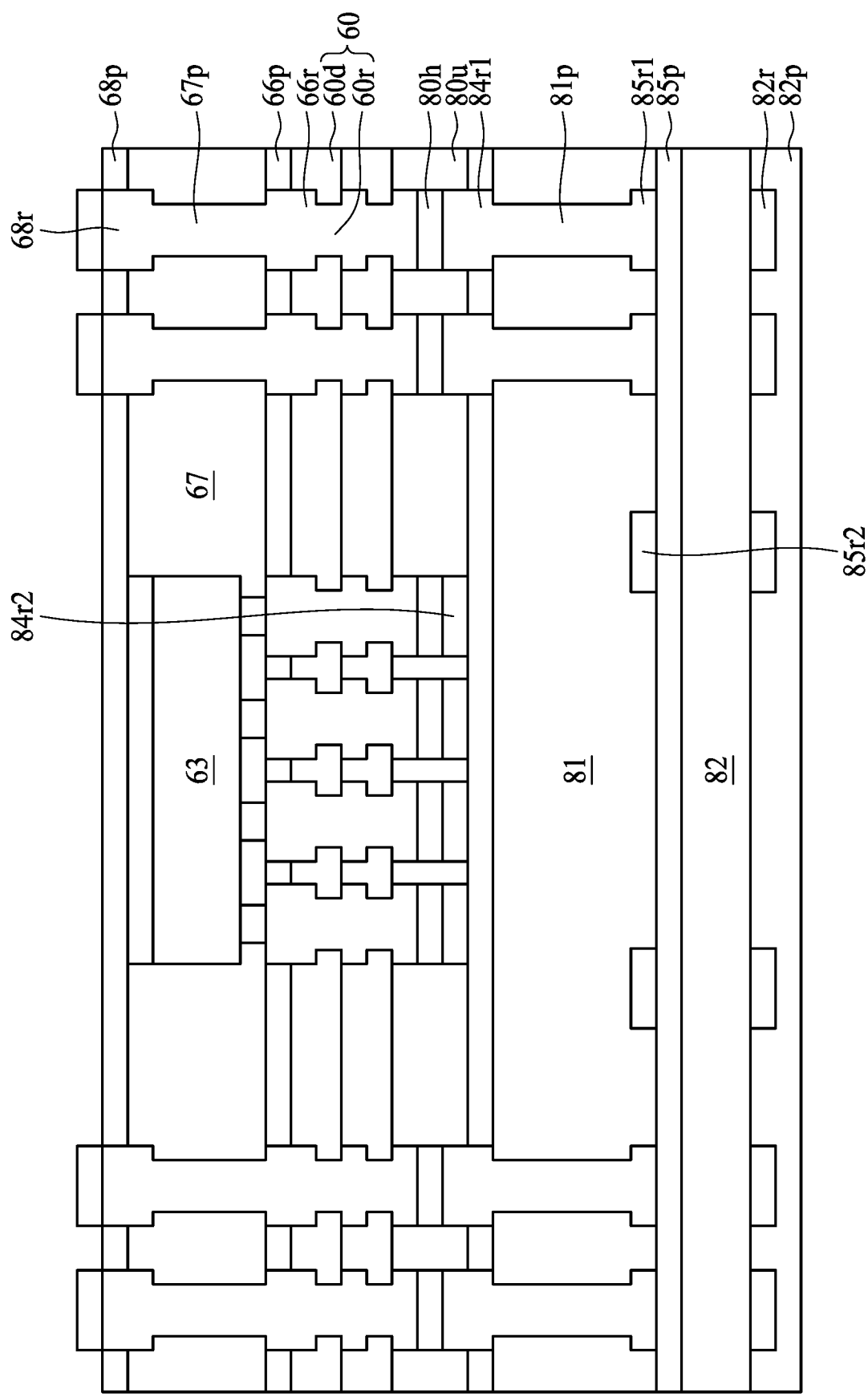

Referring to FIG. 8D, the device package illustrated in FIG. 6C is disposed on the interconnection layers 84r1 and 84r2. In some embodiments, the connection layer 80h is disposed the connection layer 60h of the device package illustrated in FIG. 6C, and then the connection layer 80h is attached to the connection layer 60h after reflow process. In some embodiments, the device package in FIG. 6C is bonded to device package in FIG. 8C by, for example, flip-chip technique. An underfill 80u may be formed between the device package in FIG. 6C and the device package in FIG. 8C to cover the interconnection layers 84r1, 84r2, 60r and connection layers 60h, 80h. Then, the carrier 89 is removed from the passivation layer 82p to form the semiconductor device package 2 as shown in FIG. 2.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations per-formed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a circuit layer having a first surface and a second surface opposite to the first surface;
    a first package body disposed on the first surface of the circuit layer;
    a first antenna penetrating the first package body and electrically connected to the circuit layer;
    a second package body disposed on the first package body, the second package body having a first surface facing away from the first package body and a second surface facing the first package body;
    an antenna pattern disposed adjacent to the first surface of the second package body;
    a third package body disposed between the first package body and the second package body; and
    a second antenna penetrating the third package body and electrically connected to the first antenna,
    wherein the third package body is spaced apart from the first package through a gap.

2. The semiconductor device package of claim 1, wherein the gap is an air gap.

3. The semiconductor device package of claim 2, further comprising:
    an electronic component disposed on the second surface of the circuit layer;
    a fourth package body disposed on the second surface of the circuit layer and covering the electronic component.

4. A semiconductor device package, comprising:
    a first package body having a first surface and a second surface opposite to the first surface;
    an antenna disposed adjacent to the first surface of the first package body;
    a first conductive layer disposed on the second surface of the first package body, the conductive layer including a first passivation layer disposed adjacent to the second surface of the first package body and a first interconnection layer disposed adjacent to a surface of the passivation layer;
    a first encapsulant disposed adjacent to the first package body and having a first surface facing the first conductive layer and a second surface opposite to the first surface;
    a second conductive layer disclosed adjacent to the second surface of the first encapsulant, the second conductive layer including a second passivation layer disposed adjacent to the second surface of the first encapsulant and a second interconnection layer disposed adjacent to a surface of the second passivation layer; and
    an electronic component electrically connected to the second conductive layer.

5. The semiconductor device package of claim 1, wherein the gap is defined by a connection layer disposed between the first package body and the third package body.

6. The semiconductor device package of claim 5, further comprising an underfill filling the gap and surrounding the connection layer.

7. The semiconductor device package of claim 5, wherein the second package body and the third package body are encapsulants.

8. The semiconductor device package of claim 5, wherein the second package body includes a glass substrate and the third package body is an encapsulant.

9. The semiconductor device package of claim 4, wherein the first package body is a glass substrate and the antenna is disposed above the first surface of the first package body.

10. The semiconductor device package of claim 9, wherein the first interconnection layer is embedded in the first encapsulant.

11. The semiconductor device package of claim 4, wherein the first package body is a second encapsulant and the antenna is embedded in the second encapsulant.

12. The semiconductor device package of claim 11, wherein the first interconnection layer is embedded in the first encapsulant.

13. The semiconductor device package of claim 4, wherein the first package body is a second encapsulant.

14. The semiconductor device package of claim 13, wherein the first interconnection layer is disposed above the first surface of the first encapsulant.

15. The semiconductor device package of claim 4, wherein the first encapsulant includes at least two encapsulants.

16. A method of manufacturing a semiconductor device package, the method comprising:
    providing a first package body, wherein an electronic component is embedded in the first package body and a circuit layer is disposed adjacent to a surface of the first package body, wherein the circuit layer comprises a first interconnection layer;
    providing a multi-layered package body, wherein the multi-layered package body comprises a second interconnection layer; and
    electrically connecting the first package body to the multi-layered package body by electrically connecting the first interconnection layer to the second interconnection layer through a connection layer.

17. The method of claim 16, further comprising disposing an underfill surrounding the connection layer.

18. The method of claim 16, wherein providing the multi-layered package body comprises:
    providing a first conductive layer;
    forming a second package body to cover the first conductive layer;
    forming a third package body on the second package body; and
    forming the second interconnection layer on the third package body.

19. The method of claim 18, further comprising disposing a second conductive layer on a surface of the second package body and the third package body covers the second conductive layer.

20. The method of claim 16, wherein providing the multi-layered package body comprises:
    providing a second package body, the second package body having a first surface and a second surface opposite to the first surface;
    forming a first conductive layer on the first surface of the second package body;
    forming a second conductive layer on the second surface of the second package body; and
    forming a third package body on the second surface of the second package body to cover the second conductive layer.

* * * * *